United States Patent [19]
Borden et al.

[11] Patent Number: 5,790,561
[45] Date of Patent: Aug. 4, 1998

[54] INTERNAL TESTABILITY SYSTEM FOR MICROPROCESSOR-BASED INTEGRATED CIRCUIT

[75] Inventors: Craig E. Borden, Placentia; Miguel A. Martinez, Yorba Linda; Alexander D. Taylor, Cupertino, all of Calif.

[73] Assignee: Rockwell International Corporation, Newport Beach, Calif.

[21] Appl. No.: 785,068

[22] Filed: Jan. 17, 1997

[51] Int. Cl.$^6$ .................................................. G01R 31/28
[52] U.S. Cl. ........................... 371/22.1; 371/22.32
[58] Field of Search ........................... 371/22.1, 22.31, 371/22.32, 22.5, 22.6, 22.36, 22.7; 395/183.01, 183.06, 183.15, 185.04, 183.21; 364/489, 550; 365/201

[56] References Cited

U.S. PATENT DOCUMENTS

| | | | |
|---|---|---|---|
| 4,817,093 | 3/1989 | Jacobs et al. | 371/25 |
| 5,329,533 | 7/1994 | Lin | 371/22.3 |
| 5,423,050 | 6/1995 | Taylor et al. | 395/575 |
| 5,475,694 | 12/1995 | Ivanov et al. | 371/22.4 |
| 5,570,375 | 10/1996 | Tsai et al. | 371/22.3 |
| 5,583,786 | 12/1996 | Needham | 364/488 |
| 5,627,842 | 5/1997 | Brown et al. | 371/22.3 |
| 5,633,877 | 5/1997 | Shepard, III et al. | 371/22.2 |

*Primary Examiner*—Robert W. Beausoliel, Jr.
*Assistant Examiner*—Nadeem Iqbal
*Attorney, Agent, or Firm*—William C. Cray; Susie H. Oh

[57] ABSTRACT

A fault isolation system for use in an integrated circuit. The fault isolation system includes multiple input shift registers which are connected end-to-end, serial output to serial input, for convenient interface with a test data input and test data output that are controlled by the test access port controller (tap controller) of conventional JTAG circuitry that is frequently provided in such integrated circuits. The multiple input shift registers include parallel inputs which receive test data from test nodes within functional blocks such as general circuit blocks and linear bus alleys. The multiple input shift registers are efficiently controlled by a global controller which talks to many local controllers. The global controller distributes control signals that are received by the local controllers. The multiple input shift registers thereafter operate in accordance with the control signals and, in order to operate "at speed," also operate in time coordination with the local clock phases driving the functional block under observation. The multiple input shift registers preferably include polynomial feedback taps in order to generate a predictable "signature" given a sequential set of parallel data subsequent to initiation to a known state.

16 Claims, 9 Drawing Sheets

INTERNAL TESTABILITY SYSTEM FOR MICROPROCESSOR-BASED INTEGRATED CIRCUIT

BACKGROUND OF THE INVENTION

1. Field of the Invention

The present invention relates to integrated circuits and, more particularly, to an innovative system for observing and isolating faults in otherwise undetectable nodes within a microprocessor based integrated circuit.

2. Description of Related Art

Manufacturers commonly make application specific integrated circuits (ASICs) having built-in testability and observability features at the external level. The Institute of Electrical and Electronic Engineers (IEEE), in fact, organized the so-called Joint Test Action Group ("JTAG") which, in 1990, published IEEE Standard 1149.1 relating to a so-called "boundary-scan architecture" (hereafter "JTAG Standard" or "JTAG architecture").

Figure 2:
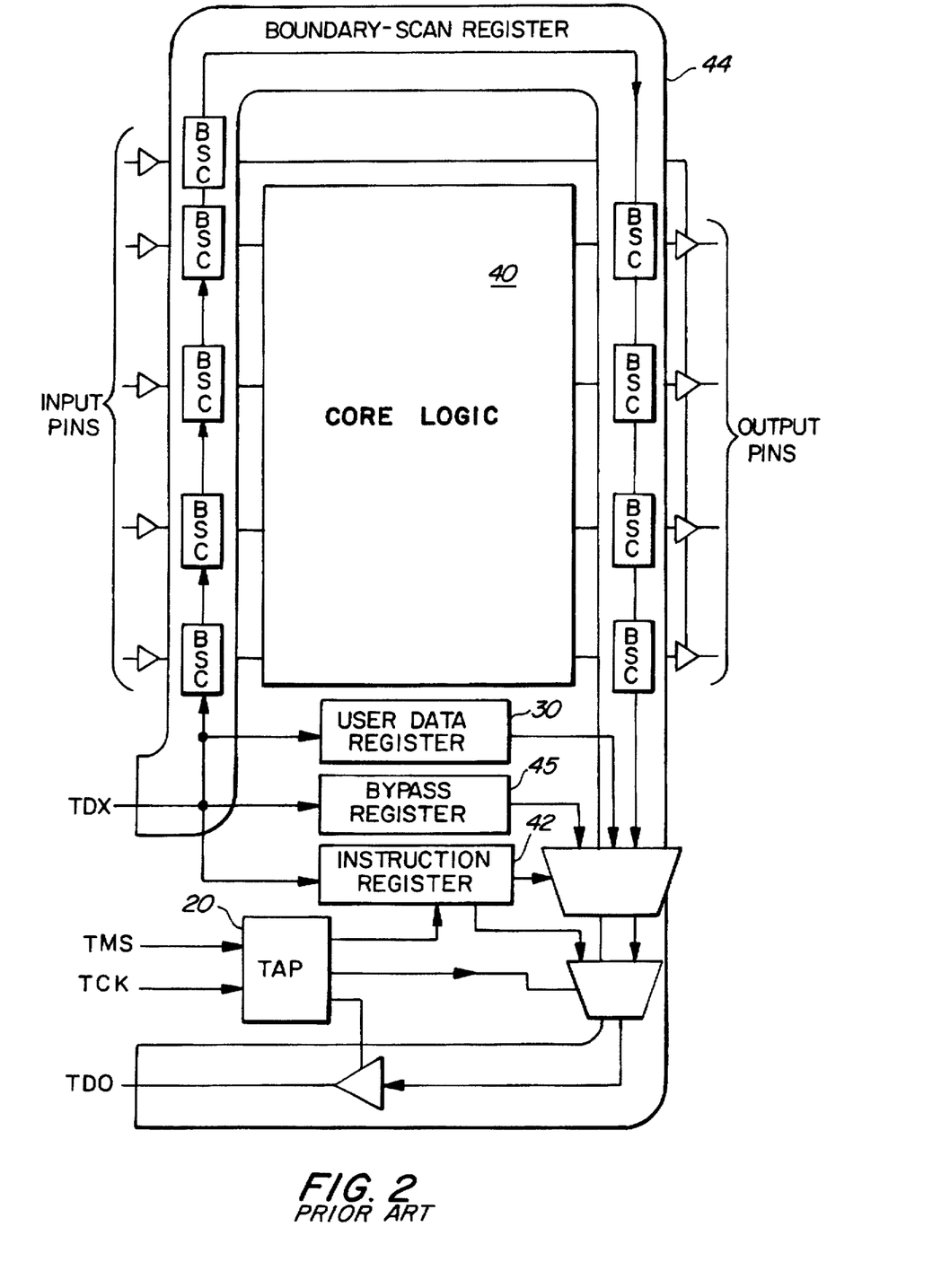
FIG. 2 is a functional block diagram showing the components of a conventional boundary scan architecture according to the JTAG Standard.

FIG. 2 shows a conventional JTAG Standard boundary-scan architecture. The JTAG architecture isolates faults at the external level of the core logic by locating a "boundary-scan cell" (BSC) at each of the device's I/O pads, i.e. around the device's boundary. The boundary-scan cells are connected together to form a relatively long "Boundary-Scan Register" that may be loaded through a Test Data Input (TDI) and unloaded through a Test Data Output (TDO). The JTAG architecture beneficially allows for fault isolation by permitting the signals at all I/O pads of one or more devices to be observed, or loaded with desired values, or both.

It has become harder to isolate faults to internal nodes within an integrated circuit, however, because of the ever greater number of circuit elements that are located deep within the device and are not directly accessible through an I/O pad. The conventional JTAG architecture is very useful for externally isolating faults to a particular device, and is often included for that purpose, but does not adequately provide for internal observability and fault isolation of nodes buried deep within a single device. Accordingly, there is a need for an internal testability system and, more particularly, for one that can be implemented in a device that already incorporates a JTAG architecture.

The inventors are aware of some prior attempts to provide internal observability in a chip, but all of the known schemes have detrimentally distributed a common, synchronous test clock to registers present throughout the chip. As ICs have grown larger, however, it has become desirable to use local clock generators to drive functional blocks at various locations in the chip. Such functional blocks include conventional circuit blocks as well as bus alleys. The use of local clock generators to reduce skew between functional blocks makes it unwise use a distributed test clock. The industry, however, has not to these inventors' knowledge created a workable system for optimally observing or testing internal nodes that are running on local clock generators.

OBJECTS AND SUMMARY OF THE INVENTION

Further features and advantages of the present invention will be appreciated by a review of the following detailed description of the preferred embodiment taken in conjunction with the following drawings.

It is an object of the present invention, therefore, to provide a fault isolation system which does not use a distributed test clock;

It is a further object of the present invention to provide a fault isolation system comprising multiple input shift registers that are driven by local clock phases used in the functional block under observation; and It is a further object of the present invention to use minial chip area by distributing only a minimal number of control signals.

The present invention achieves the above objects and others by providing a fault isolation system for observing a plurality of functional blocks within an integrated circuit that are driven by local clock signals comprising: A multiple input shift register located near the functional block and having a serial input, a serial output, and a plurality of parallel inputs which receive test data from test nodes within the functional block; a global controller including means for distributing a control signal to implement a desired function within the multiple input shift register in accordance with an external command; and a local controller including means for receiving the control signal distributed by said global controller, means for receiving the local clock signal, and means for controlling the multiple input shift register in accordance with a control signal and in time coordination with the local clock signal. In a preferred embodiment, the external command to the global controller is accomplished by shifting in a special user command via a test data input of a standard JTAG tap controller, the global controller decoding the special user command.

The preferred multiple input shift registers are comprised of a plurality of master/slave latches wherein each master latch is connected to a corresponding parallel input. The preferred multiple input shift register further includes feedback taps from one or more stages to a first stage via an exclusive OR gate in order to implement a polynomial expression which causes the shift register to finish in a particular "signature" state when started from a known state and presented with particular sequential sets of data at the parallel inputs.

BRIEF DESCRIPTION OF THE DRAWINGS

Further features and advantages of the present invention will be appreciated by a review of the following detailed description of the preferred embodiment taken in conjunction with the following drawings.

DETAILED DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art, since the general principles of the present invention have been defined herein specifically to provide an internal testability system for a microprocessor-based integrated circuit.

Figure 1:
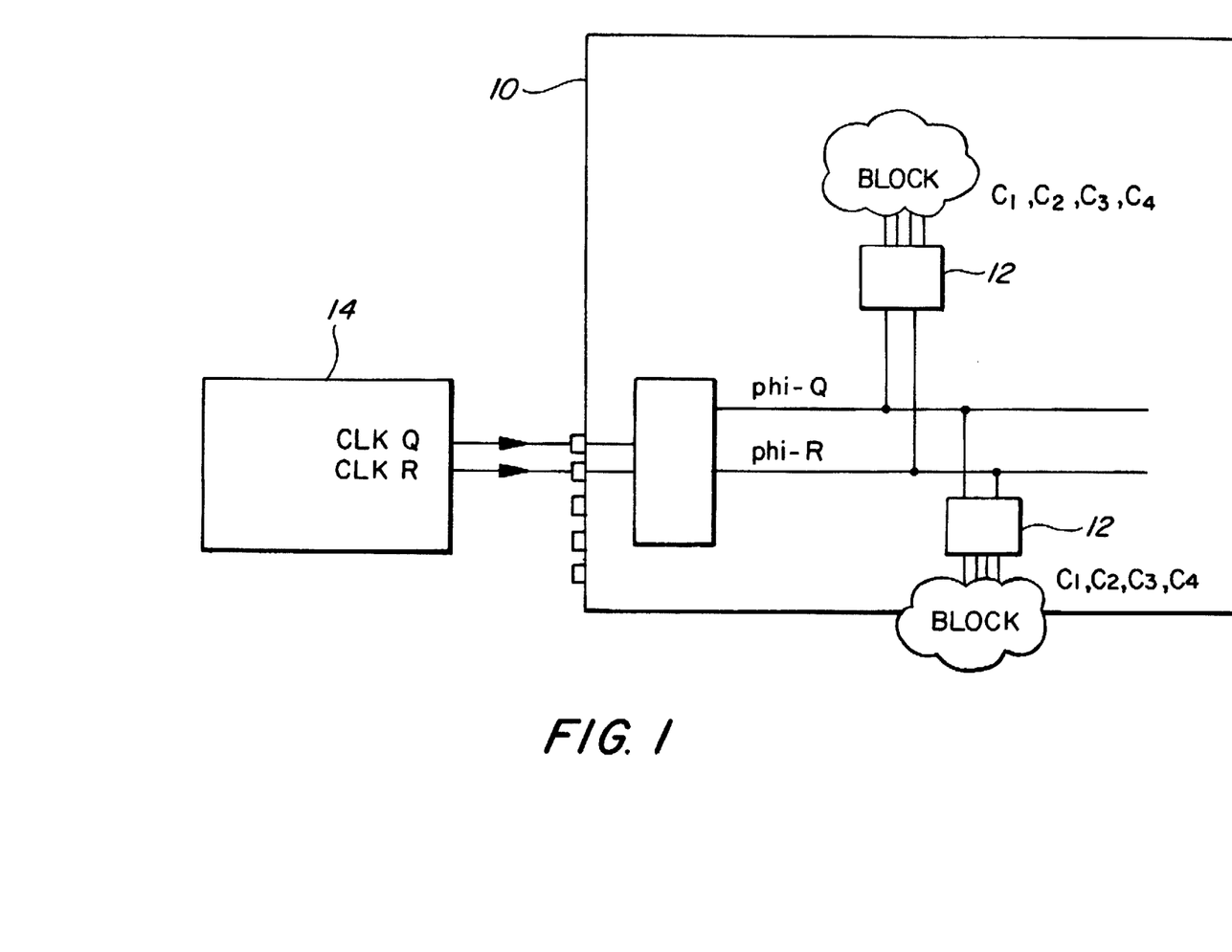
FIG. 1 is a simplified block diagram of an integrated circuit 10 in which may benefit from a fault isolation system 100 according to the present invention, this particular integrated circuit 10 having several local clock generators 12 which generate local clock phases c1, c2, c3, c4.

As suggested by FIG. 1, a microprocessor-based IC or chip 10 often has functional blocks that are driven by local clock generators 12 which generate local clock phases from a distributed clock. The local clocks 12 have become necessary, as chips have grown larger and clock frequencies have increased to 50 MHz, and more, in order to fine tune each local clock generator 12 to its block and minimize skew between blocks.

The preferred embodiment is directed to a chip 10 having local clock generators 12 which generate four local clock phases, c1, c2, c3, c4 based on a distributed, two-phase system clock phi-Q, phi-R. The principals of the present invention, however, will work equally well with other local clocking schemes. FIG. 1 shows the chip 10 being driven by a controllable test clock 14 which forms part of a testing station. It should be understood, however, that the chip 10 is ordinarily driven by an external system clock (not shown).

FIG. 2 shows a conventional JTAG architecture wherein test data may be shifted from TDI to TDO through various scan paths. The JTAG architecture includes an Instruction Register 42 for shifting in control instructions and several data registers 44, 45, 30. The main data register is the Boundary-Scan Register 44. The other data registers are a Bypass Register 45 for connecting TDI directly to TDO, and one or more User Registers 30 (only one is shown) which may be used to implement special user functions.

Figure 3:
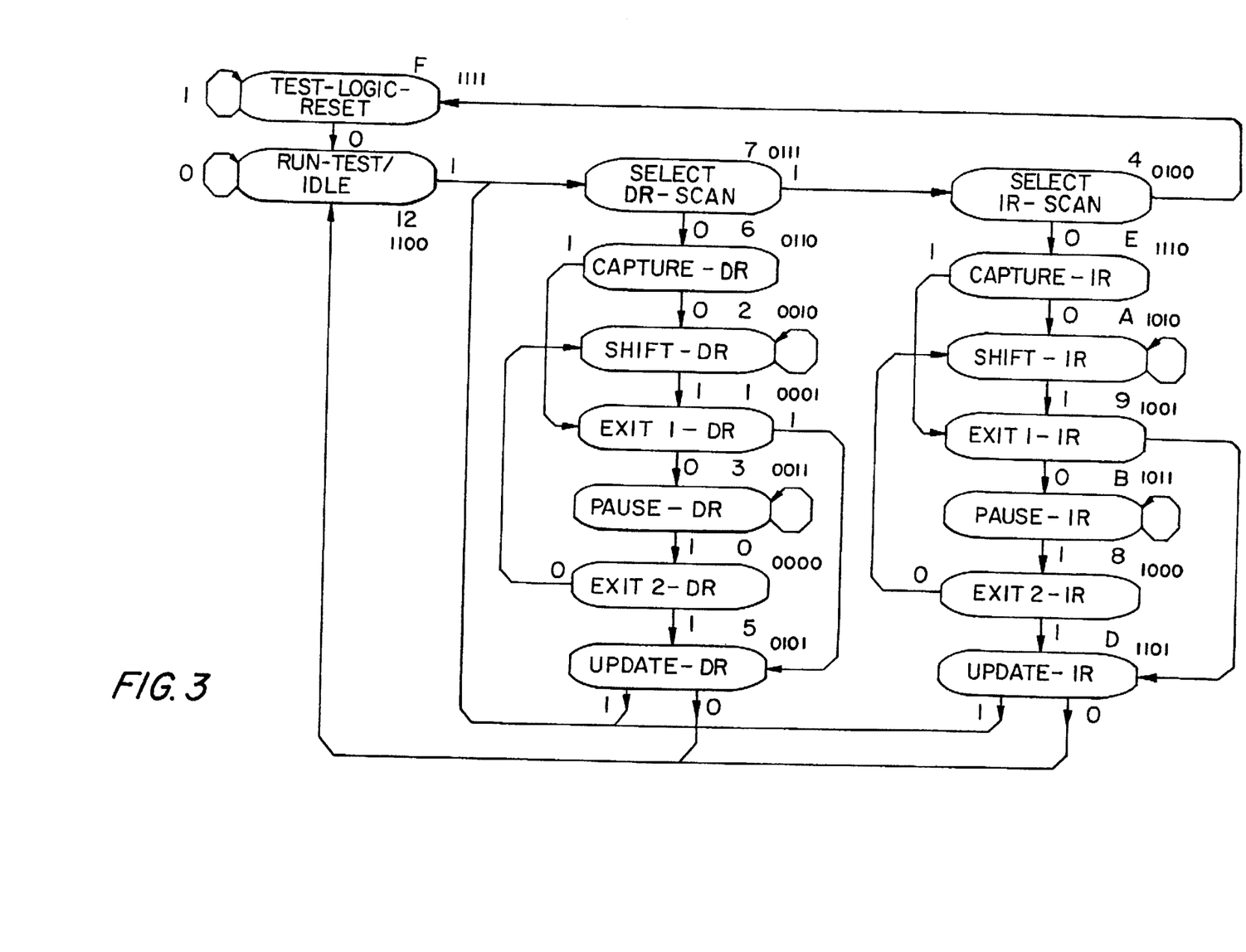
FIG. 3 is a state diagram for the TAP controller 20 of FIG. 2.

A data register is selected and then shifted, from TDI to TDO, under the control of a test access port (TAP) controller 20. As shown in FIG. 3, the TAP controller 20 is configured as a 16-state finite state machine. The state of the TAP controller 20 is sequenced by an external test clock TCK in accordance with a test mode select signal TMS. The state diagram has two primary paths, whereby the TAP controller 20 may be sequenced to control the Instruction Register 42 (right path) or to control a Data Register 44, 45, 30 (left path) that was selected by bits previously shifted into the Instruction Register 42. The conventional User Register 30 is driven, therefore, by the standard JTAG test clock TCK.

Figure 4:
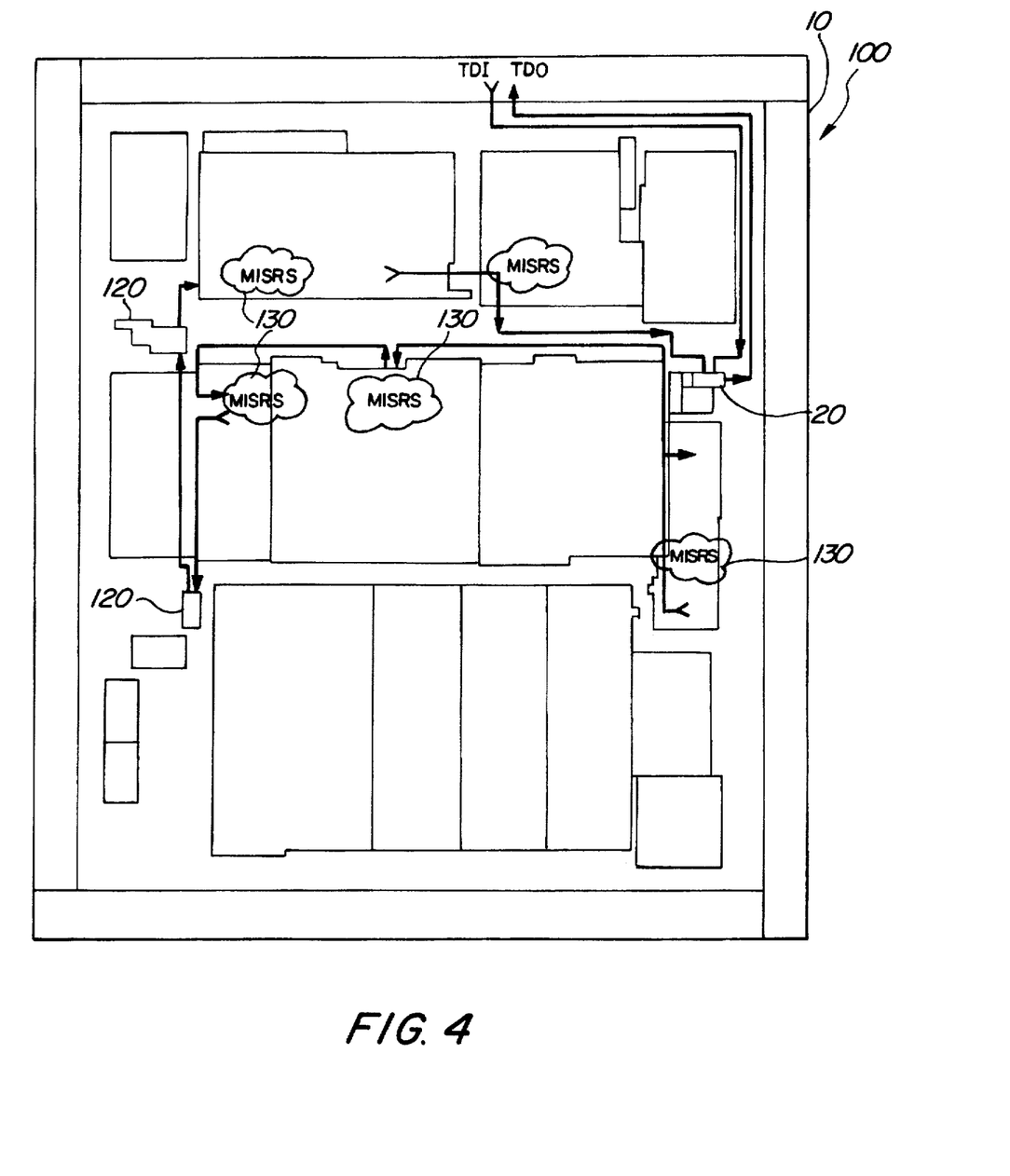
FIG. 4 is a block diagram of an exemplary integrated circuit 10 incorporating the fault isolation system 100 according to the present invention.

As suggested by FIG. 4, a fault isolation system 100 according to the present invention comprises a special "User Register" that is formed from a series connected chain of multiple input shift registers (MISRs) 120, 130 that are strategically associated with functional blocks within the chip 10. The conventional User Register 30, as explained above, is driven in its entirety by the external, JTAG test clock TCK. The MISRs 120, 130 of the present invention, however, are individually clocked with internal, locally generated clock phases. The resulting benefits of this unique approach are many.

There are presently two preferred types of MISRs: (1) Bus MISRs 120; and (2) Block MISRs 130. The MISRs 120, 130 are electronically identical, but a Bus MISR 120 is geometrically designed for connection to a linear bus and a Block MISR 130 is geometrically designed for connection to desired test points in a general circuit block. In either case, the MISRs 120, 130 are connected together to form a "MISR chain" that is beneficially accessible through TDI and TDO under the control of a JTAG tap controller 20.

Figure 5:
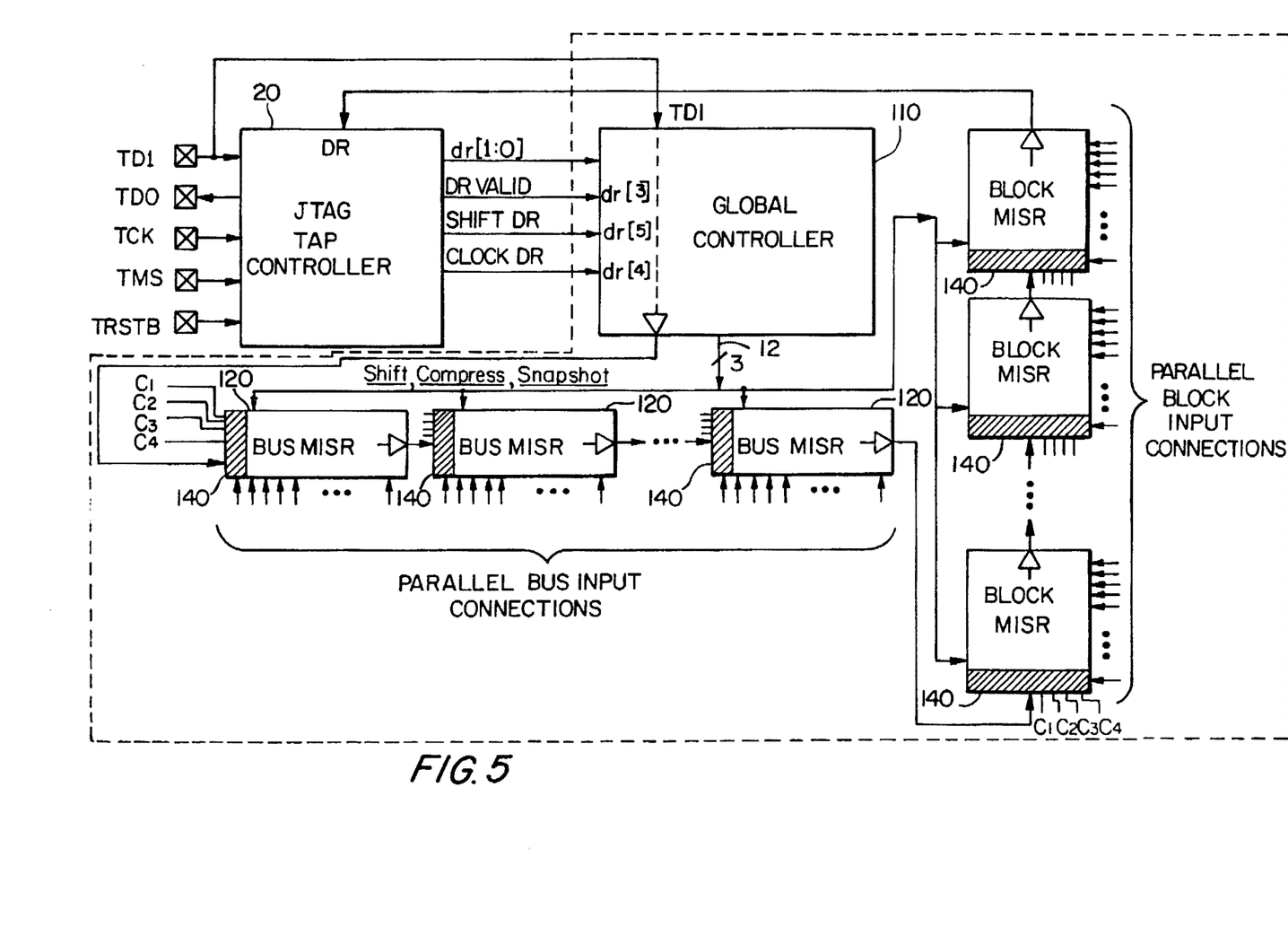
FIG. 5 is a block diagram showing the preferred interface between the fault isolation system 100 of the present invention and the TAP controller 20, the fault isolation system 100 comprising a global controller 110 and a plurality of serially interconnected Bus MISRs 120 and Block MISRs 130, each driven by a local controller 140.
Figure 6:
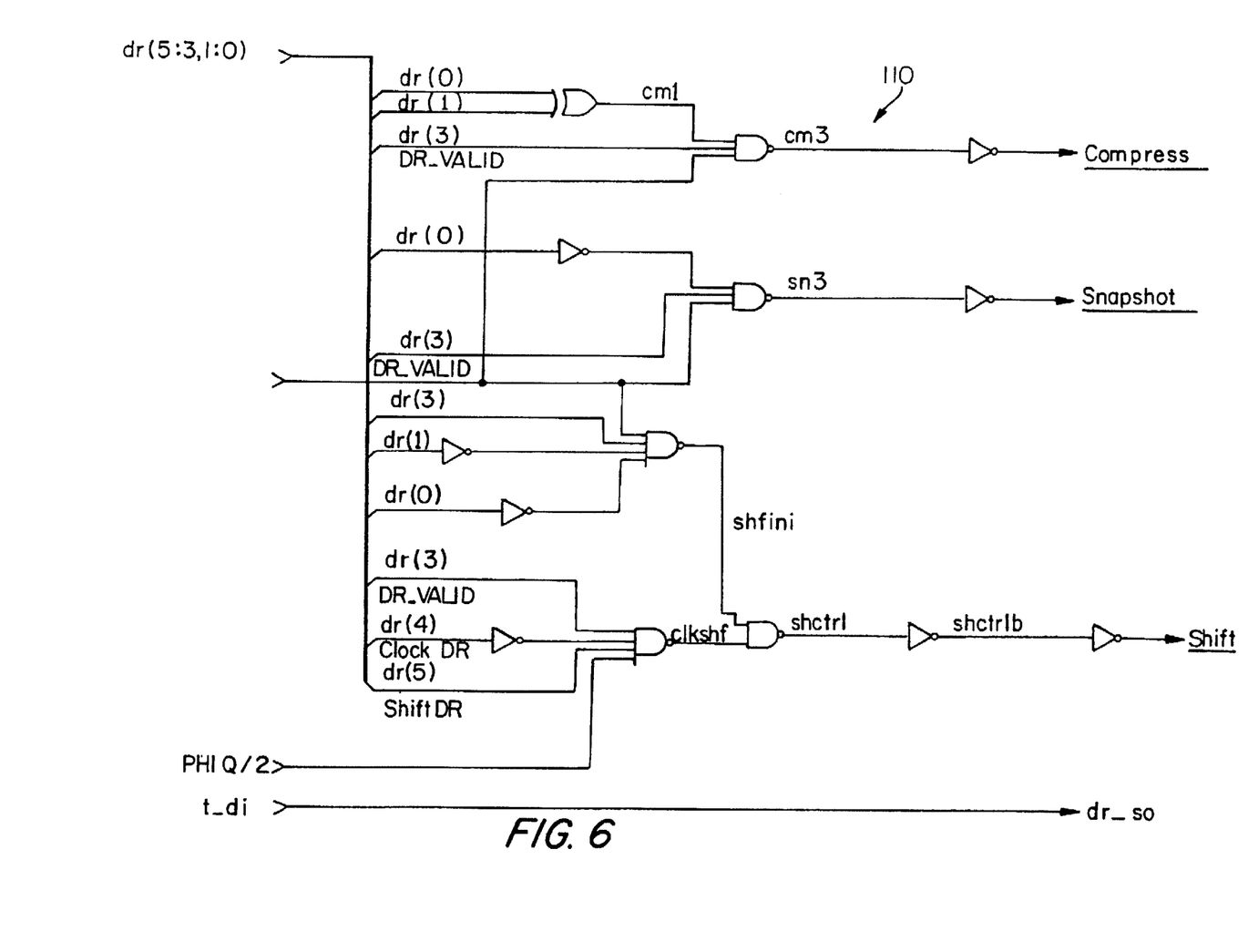
FIG. 6 is a logic level diagram of the global controller 110 of FIG. 5.
Figure 7:
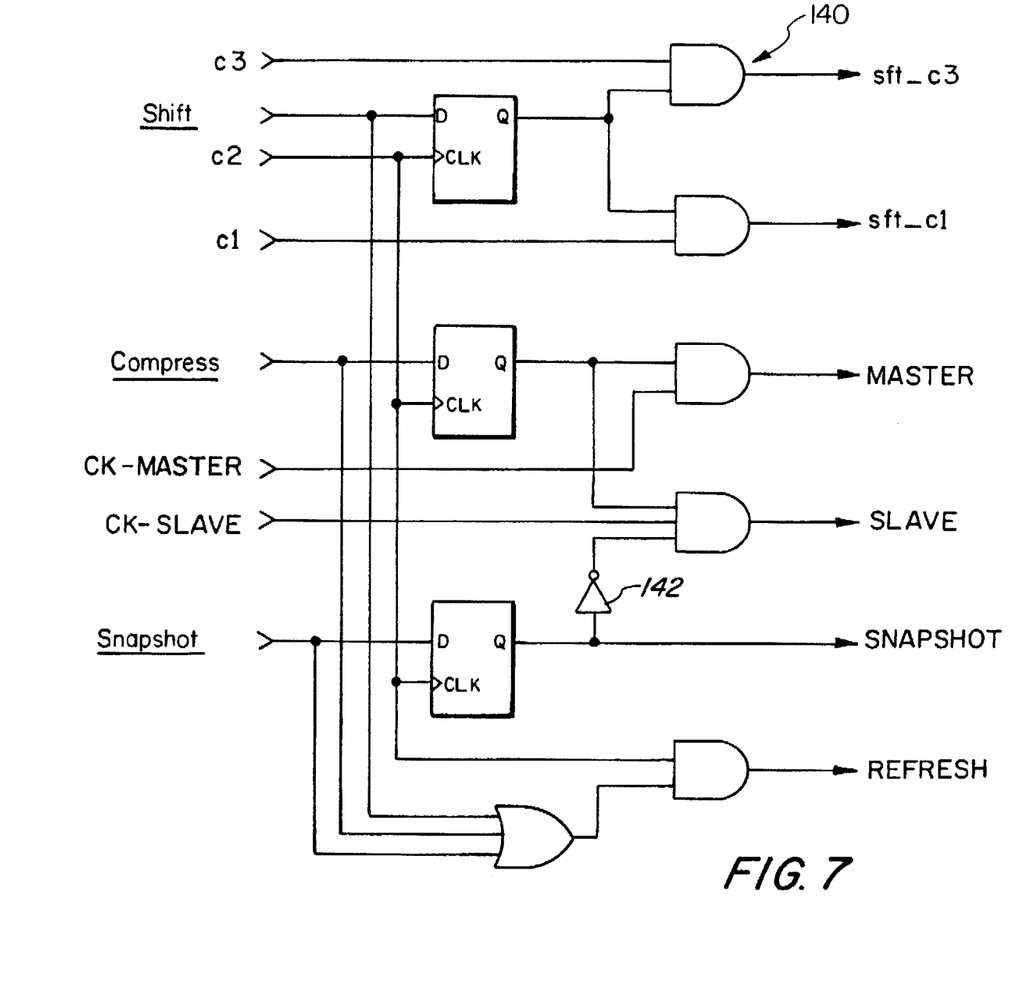
FIG. 7 is a logic level diagram of the preferred local controller 140 that controls a Bus MISR 120 or a Block MISR 130 in response to control signals from the global controller 110 and in time coordination with local clock phases.
Figure 8:
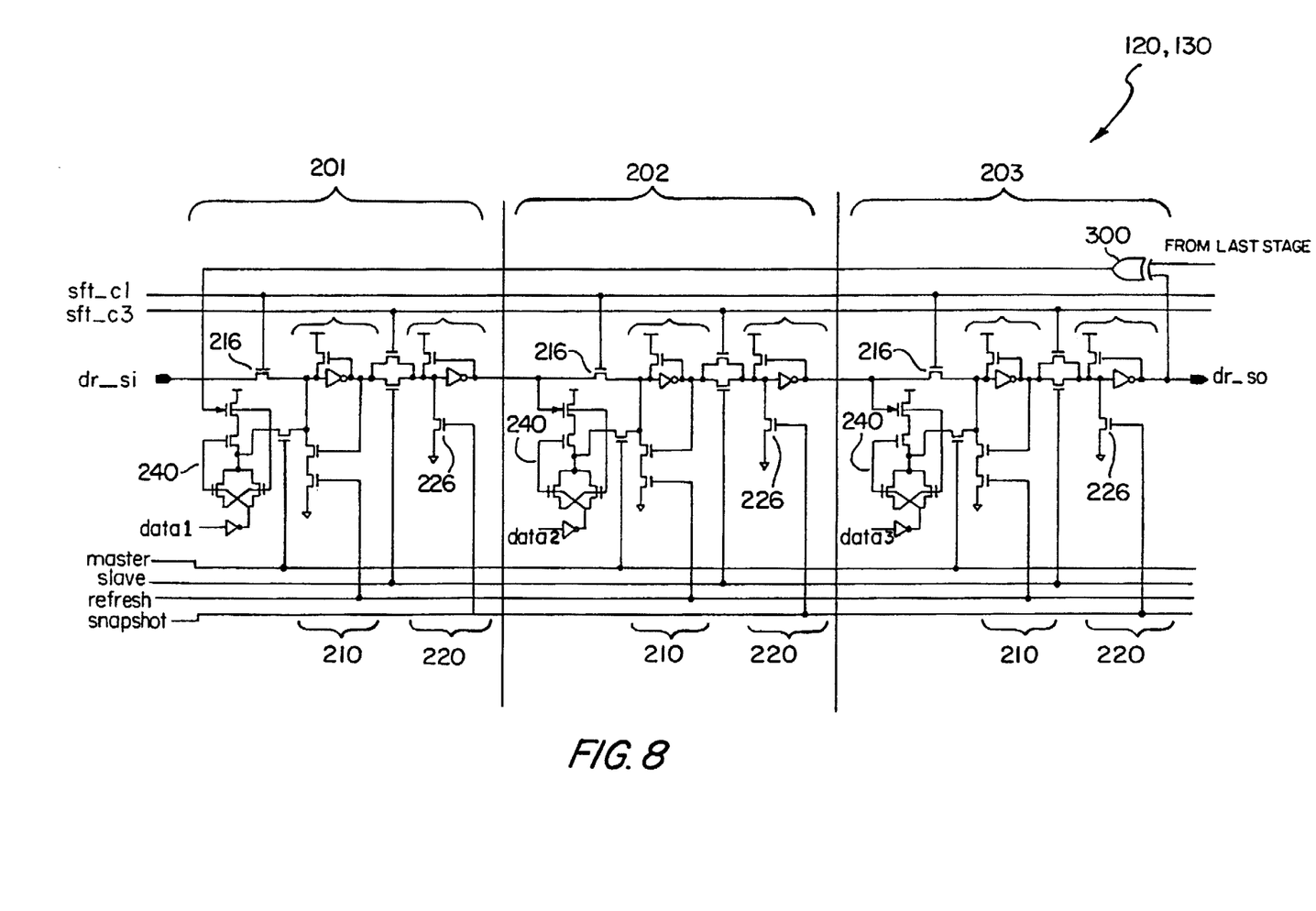
FIG. 8 is a circuit schematic illustrating 3 of the 33 stages in a preferred bus MISR 120 or a block MISR 130.

FIG. 5 shows the preferred fault isolation system 100 comprising a global controller 110, a plurality of local controllers 140, and a corresponding plurality of MISRs 120, 130 arranged in a chain. FIGS. 6, 7, and 8, respectively, show the preferred logical implementation of the global controller 110, a local controller 140, and a MISR 120, 130.

As shown in FIG. 5, the fault isolation system 100 is beneficially controlled by a JTAG TAP controller 20 that is often included in an existing ASIC design. The TAP controller instruction register is loaded with "user specified" instructions which are decoded by the global controller 110 to drive the MISRs. Each MISR, however, operates in synch with the local clock phases that drive the functional block being observed by the MISR. This is possible because the TAP controller 20 operates a plurality of MISRs 120, 130 via the unique global controller 110 and a corresponding plurality of local controllers 140.

The preferred TAP controller 20 uses a 4-bit instruction register to implement the following instructions, the highlighted instructions 0100, 0101, and 0110 relating to the MISRs:

| IR Number | Bits | Description | IR Number | Bits | Description |
|---|---|---|---|---|---|
| 0 | 0000 | Extest | 8 | 1000 | undefined |
| 1 | 0001 | Sample/Preload | 9 | 1001 | undefined |
| 2 | 0010 | Intest | 10 | 1010 | undefined |
| 3 | 0011 | Runtest | 11 | 1011 | undefined |
| 4 | 0100 | Init Mode | 12 | 1100 | Hi Z |
| 5 | 0101 | Compress Mode | 13 | 1101 | Clamp |
| 6 | 0110 | Snapshot Mode | 14 | 1110 | ID Register |
| 7 | 0111 | undefined | 15 | 1111 | Bypass |

The TAP controller 20, in response to one of the MISR related instructions 0100, 0101, or 0110, outputs the following data register control signals DR[6:0] to the global controller 110:

| Signal | Name | Function |
|---|---|---|
| DR[0] | | Instruction Register, bit 0 |
| DR[1] | | Instruction Register, bit 1 |
| DR[2] | not needed | Instruction Register, bit 2 |
| DR[3] | DR_valid | Informs the global controller 110 that one of the MISR modes is active |
| DR[4] | ClockDR | (TCK) Clocks the logic within the global controller 110 |
| DR[5] | ShiftDR | Enables/disables the shifting of data through the MISRs 120, 130. |
| DR[6] | not used | |

FIG. 6 shows the logical construction of the preferred global controller 110. As shown, the global controller 110 decodes the data register control signals DR[6:0] and a "runtest" signal to generate three global control signals 112 that are distributed to the local controllers 140. The global control signals (shift, compress, and snapshot) cause the local controllers 140 to operate the MISRs 120, 130 in one of the following four modes:

| MISR Mode | Global Control Signals | | |
|---|---|---|---|
| | Shift | Compress | Snapshot |
| Init | 1 | 0 | 1 |
| Compress | 0 | 1 | 0 |
| Snapshot | 0 | 1 | 1 |
| Shift | 1 | 0 | 0 |

FIG. 7 shows the preferred construction of a local controller 140. As shown, the local controller 140 generally receives global control signals (shift, compress, and snapshot) and local clock phases (c1, c2, c3, c4) on the left and then outputs local control signals on the right. In more detail, the preferred local controller 140 latches the shift, compress, and snapshot control signals in response to a local clock phase (here c2) and then creates local control signals based on the local clock phases c1, c2, c3, c4. As a result, the MISRs are collectively controlled by the global control signals, but are individually driven by the local clock phases associated with a particular bus alley or functional block.

FIG. 8 shows a preferred bus or block MISR 120, 130. The preferred MISR 120, 130 has thirty-three stages to simplify the feedback circuitry needed for the Compression Mode, as explained below, but the figure only shows three stages 201, 202, 203, for simplicity. As shown, each stage 201, 202, 203 of the preferred MISR 120, 130 has a master latch 210 and a slave latch 220. Each master latch 210 receive its input directly from a previous slave latch 210 through a transistor 216 or from a logical combination of the data in a previous slave latch 210 and a parallel data input (data1, data2, etc . . . ) that are passed through an XOR gate. The only exception is the master latch 210 of the first stage 201 which receives its data from a previous MISR or from an XOR combination of parallel data data1 and a linear feedback signal taken from an XOR gate 300.

In the preferred embodiment, each MISR can receive full voltage levels (0 to 3.3 volts, nominal) or reduced voltage levels (0 to 2.6 volts, nominal) that are sometimes used for power savings technique in a bus alley. This versatility is preferably accomplished by placing an NFET, with its gate tied high, in series with the inverters at data1, data2, etc. (see FIG. 8, NFET not shown). This technique typically uses an NFET threshold voltage of 0.6 to 0.7 volts.

The preferred operation of the global controller 110 (FIG. 6), the local controllers 140 (FIG. 7), and the MISRs 120, 130 (FIG. 8) during each MISR Mode can be best understood from the following description with reference to FIGS. 6, 7, and 8.

(1) Init Mode. The Init Mode is selected by loading the JTAG instruction register with the private instruction code 0100. The Init Mode is used to clear the MISRs to a known state which, in the embodiment shown, is one, one in the first stage 201 and all zeroes in the remaining stages 202, 203. The preferred initialization to one, one, followed by many zeroes provides a unique code series to confirm that initialization has occurred. The Init Mode combines two of the global control signals, snapshot and shift, to rapidly initialize all of the MISRs. In particular, the snapshot signal (FIG. 6 to FIG. 7) generates a local signal snapshot which turns on a transistor 226 (FIG. 7 to FIG. 8) that forces the output of the slave latch 220 to one. The shift signal (FIG. 6 to FIG. 7) causes a subsequent shift clocking sft_c3, sft_c1 (FIG. 7 to FIG. 8) that feeds the one from each slave 220 into the master 210 of the next stage through a transistor 216, causing the master 210 to latch a zero.

Figure 9:
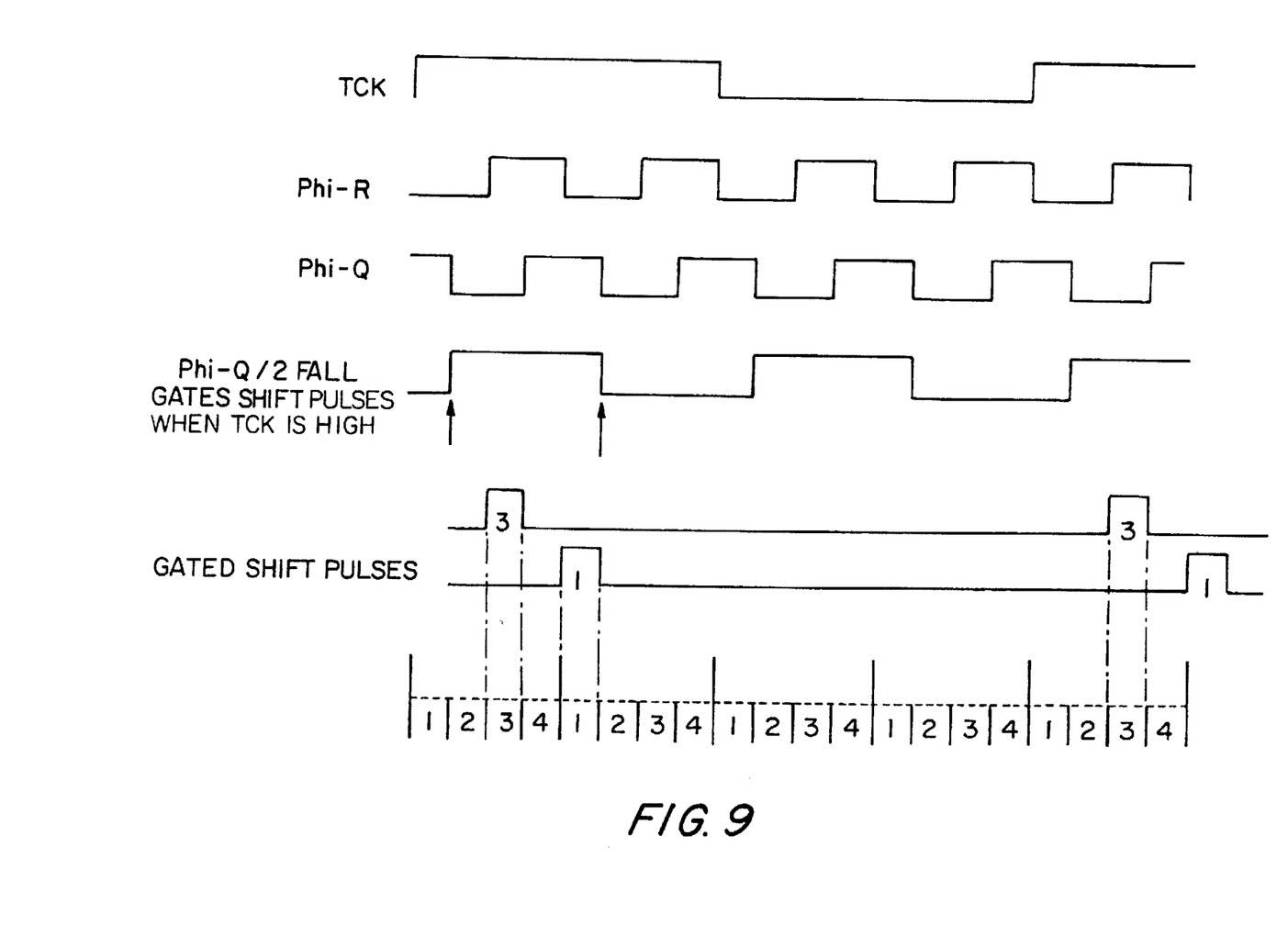
FIG. 9 is a timing diagram showing how the local shift pulses sft_c1 and sft_c3 of FIG. 7 are generated two clock phases after the rising edge of each test clock TCK by using a phi-Q/2 signal to gate a location combination of TCK, phi-Q, and phi-R.

(2) Compress Mode. The Compress Mode is selected by loading the JTAG instruction register with private instruction code 0101. In Compress Mode, parallel data (data1, data2, etc . . . ) is passed through an XOR gate 240 with data from a previous stage and loaded into the master latch 210 of the next stage. Subsequently, the result is passed to the slave latch 220 and made available to the XOR gate 240 of the next stage. This process is accomplished with the global control signal compress enabling master/slave clocking (FIG. 6 to FIG. 7) which master/slave clocking then drives the master and slave latches 210, 220 (FIG. 7 to FIG. 8). In the preferred embodiment, the local phase c2 is not available for master clocking because local phase c2 is used to latch in the global control signals as shown in FIGS. 7 and 9. The local phases connected to the ck_master and ck_slave inputs of each local controller 140, however, can be any of the following local phase combinations, as desired:

| ck_master | ck_slave |
|---|---|
| c1 | c3 |
| c3 | c1 |
| c4 | c2 |

During the Compress Mode, each MISR is isolated from its neighbors and has no effect on the input to the next MISR in the chain. Each MISR 120, 130 operates, therefore, as a linear feedback shift register. In the Compress Mode, the incoming data sequence is compressed into a "signature" that is unique for repeatable input data and clocking provided that the MISR is first initialized. The resulting signature will be useless unless the data signals have a known repeatable starting state when the Compression Mode is selected.

The preferred MISR 120, 130 operates with 32-bit data and must, therefore, be at least 32 stages long. A 33-stage MISR 120, 30 is preferred because this number of stages only requires two feedback taps (13, 0) to implement a linear feedback polynomial having $2^n-1$ unique states. Other polynomials, of course, may be used, but this two-tap polynomial is ideal because it may be implemented to operate faster than three or more taps by using a high speed, two input exclusive OR gate 300, as shown in FIG. 8.

(3) Snapshot Mode. The Snapshot Mode is selected by loading the JTAG instruction register with private instruction code 0110. In Snapshot Mode, the MISRs take a "snapshot" of the input data (data1, data2, etc . . . ) and store it in the master latches 210. The Snapshot Mode, like the Init Mode, combines the global control signal, snapshot, with another global control signal, here compress. The global control signal snapshot (FIG. 6 to FIG. 7) creates the local signal snapshot which turns on the transistor 226 and forces the outputs of the slave latches 220 to one (FIG. 7 to FIG. 8). The global control signal compress simultaneously begins the master clocking, the slave clocking being suppressed by the global control signal snapshot and an inverter 142 (FIG. 6 to FIG. 7 to FIG. 8).

Each time the master latches 210 are clocked, the previous data is overwritten with a snapshot of the new data. The Snapshot Mode is useful for observing the actual at-speed data on the buses. Each MISR is isolated from its neighbor during the Snapshot Mode and has no effect on the input to the next MISR in the chain.

(4) Shift Mode. The Shift Mode is selected by controlling the state of the TAP controller 20. In Shift Mode, either the compressed "signature" or a snapshot of the data is shifted out. During the Shift Mode, all MISRs 120, 130 are connected in series forming one huge shift register. The last MISR output dr_so connects to TDO via a multiplexer (not shown) that is controlled by the TAP controller 20 so that the MISR data may be shifted out when the JTAG is put into the SHIFT-DR state on the JTAG state diagram. This causes the TAP controller 20 to transmit a ShiftDR signal to the global controller, as shown in FIGS. 5 and 6. A phiQ/2 signal is provided to the global controller 110, as shown in FIG. 6, in order to synchronize the shift pulses with the frequency of the JTAG test clock TCK, as shown in FIG. 9. The input of the first MISR in the chain is connected to the buffered JTAG TDI scan in signal, as shown in FIG. 5. This allows the shift operation to place serial data, such as an initialization seed, into the MISRs.

The above disclosure has been provided to describe a fault isolation system that is globally controlled, but uses local clocking to react to such control. The invention should not be limited by the preferred embodiment described above, but should rather be interpreted in view of the following claims.

What is claimed is:

1. A fault isolation system for observing a functional block that is located within an integrated circuit containing a serial test interface driven by an external test clock and wherein the functional block is driven by a local clock signal generated by a local clock generator located near the functional block, comprising:

a multiple input shift register located near the functional block and having a serial input, a serial output, and a plurality of parallel inputs which receive test data from test nodes within the functional block;

a global controller including means for distributing a control signal to implement a desired function within the multiple input shift register in accordance with an external command; and a local controller including;

means for receiving the control signal distributed by said global controller;

means for receiving the local clock signal;

means for controlling the multiple input shift register in accordance with the control signal; and means for clocking the multiple input shift register in time coordination with the local clock signal without direct connection to the external test clock.

2. The fault isolation system of claim 1 wherein the multiple input shift register further comprises a plurality of stages that are each connected to one of the parallel inputs.

3. The fault isolation system of claim 2 wherein each stage comprises a master latch and a slave latch, each master latch being connected to a corresponding parallel input.

4. The fault isolation system of claim 3 wherein the control signal distributed by the global controller is a shift control signal for shifting test data in the serial input and out the serial output of the multiple input shift register and wherein the local controller shifts data from latch to latch in time coordination with the local clock.

5. The fault isolation system of claim 3 wherein the control signal distributed by the global controller is a snapshot control signal for taking a "snapshot" of the test nodes and wherein the local controller loads each master latch with test data from the corresponding parallel inputs for later output.

6. The fault isolation system of claim 2 wherein one or more stages are fed back to a first stage to implement a polynomial expression which causes the stages to end in a particular "signature" state when started from a known state and presented with particular, sequential sets of data at the parallel inputs.

7. A fault isolation system adapted to operate with an integrated circuit having a plurality of functional blocks that are driven by local clock signals generated by local clock generators and which integrated circuit includes a serial test access port having a test data input (TDI) and a test data output (TDO) driven by an external test clock comprising:

a plurality of multiple input shift registers (MISR), each MISR having a plurality of parallel inputs which receive test data from a corresponding plurality of test nodes within a functional block, each MISR having a serial input and a serial output, said plurality of MISR interconnected end to end from the test data input (TDI) to the test data output (TDO) of the serial test access port for shifting data in and out of the plurality of MISRs;

a global controller including a means for distributing a control signal to all of the MISRs to implement a desired function within the MISRs in accordance with an external command shifted into the serial test access port; and a plurality of local controllers, each local controller having;

means for receiving the control signal from the global controller;

means for receiving a local clock signal that is driving a functional block associated with the local controller means;

for controlling at least one MISR in accordance with the control signal and means for clocking the MISR in time coordination with the local clock signal without direct connection to the external test clock.

8. The fault isolation system of claim 7 wherein the functional blocks are general circuit blocks.

9. The fault isolation system of claim 7 wherein the functional blocks are bus alleys.

10. The fault isolation system of claim 7 wherein each of the plurality of multiple input shift registers further comprises a plurality of stages that are each connected to a corresponding one of the parallel inputs.

11. The fault isolation system of claim 10 wherein each stage comprises a master latch and a slave latch, each master latch being connected to a corresponding parallel input.

12. The fault isolation system of claim 11 wherein the control signal distributed by the global controller is a shift control signal for shifting test data in the serial input and out the serial output of each multiple input shift register and wherein the local controller shifts data from latch to latch in time coordination with the local clock.

13. The fault isolation system of claim 11 wherein the control signal distributed by the global controller is a snapshot control signal for taking a "snapshot" of the test nodes and wherein the local controller loads each master latch with test data from the corresponding parallel inputs for later output.

14. The fault isolation system of claim 10 wherein one or more stages are fed back to a first stage to implement a polynomial expression which causes the stages to end in a particular "signature" state when started from a known state and presented with a particular, sequential sets of data at the parallel inputs.

15. The system of claim 1 wherein the global controller operates in accordance with an external command from a standard 1149.1 JTAG tap controller.

16. The system of claim 7 wherein the means for distributing comprise a global controller that operates in accordance with an external command from a standard 1149.1 JTAG tap controller.

* * * * *